United States Patent [19]

Goldberg

[11] Patent Number: 4,868,510
[45] Date of Patent: Sep. 19, 1989

[54] DEVICE FOR FIXING THE PHASE OF FREQUENCY SYNTHESIZER OUTPUTS

[75] Inventor: Bar-Giora Goldberg, San Diego, Calif.

[73] Assignee: Sciteq Electronics, Inc., San Diego, Calif.

[21] Appl. No.: 122,943

[22] Filed: Nov. 19, 1987

[51] Int. Cl.$^4$ .................. H03B 19/00; H03L 7/00
[52] U.S. Cl. ..................... 328/14; 331/40; 307/271
[58] Field of Search ............. 328/14, 15, 109; 331/39, 40; 307/271

[56] References Cited

U.S. PATENT DOCUMENTS 4,725,786  2/1988  Papaieck ........................... 328/14

Primary Examiner—Stanley D. Miller
Assistant Examiner—Richard Roseen
Attorney, Agent, or Firm—Brown, Martin, Haller & Meador

[57] ABSTRACT

An improvement in a frequency synthesizer having a generator which produces mix frequencies and at least one mix and filter stage, said stage having a frequency divider. The improvement comprising: (1) a frequency divider for producing a periodic signal the frequency of which is an integer divisor of the mix frequencies, (2) a one-shot for producing an enabling signal whenever a change occurs in the selection of the frequency being synthesized, the duration of the enabling signal being sufficient to ensure coincidence of it and said periodic signal, and (3) a coincidence gate for resetting the frequency divider of each mix and filter stage to a predetermined state whenever there is a coincidence of the enabling signal and the periodic signal.

15 Claims, 2 Drawing Sheets

DEVICE FOR FIXING THE PHASE OF FREQUENCY SYNTHESIZER OUTPUTS

BACKGROUND OF THE INVENTION

This invention relates in general to synthesizers of periodic signals of selectable frequency commonly referred to as "frequency synthesizers" and in particular to frequency synthesizers which utilize direct mix and filter stages in their synthesis process.

Some conventional frequency synthesizers utilize a plurality of serially ganged mix and filter stages, such as the commonly referred to "decade" stages, in their synthesis process. Each stage performs the function of mixing an input periodic signal with one or more mix frequencies generated by a mix frequency generator, and dividing the mixed signal by ten, the input periodic signal being the output signal from a preceding stage or, if the first stage, a reference oscillator signal from an external source, typically 10 Mhz. In a synthesizer using decade stages, each stage adds one decimal digit of resolution. The number of stages depends on the desired resolution of the output signal. In each stage, all of the functions are linear except for the divider, which is a nonlinear device causing transient anomalies at frequency switching. A change in frequency causes a transient condition in which the divider's state is undefined. The non-linearity of the divider causes the phase of the synthesizer output signals to be indeterminable.

For example, when first selecting a signal of frequency X, the phase of the signal is unpredictable, and likewise when reselecting frequency X from one or more intervening frequencies, the phase is not only unpredictable, but it is not necessarily the same phase as when the frequency X was first selected, there being an ambiguity of ten in the phase of the signal per decade stage divider when returning to frequency X.

Heretofore, the prior art has not presented a means nor a method which can keep the phase of a given output frequency constant no matter how many times the frequency is selected and reselected. This invention presents a means and a method adapted to make the phase of all selected frequencies determinate.

Other advantages and attributes of this invention will be readily discernible upon the reading of the text hereinafter.

SUMMARY OF THE INVENTION

This invention presents an improvement in a synthesizer of periodic signals of selectable frequencies having a generator which produces mix frequencies and at least one mix and filter stage, said stage having a frequency divider. The improvement comprises: (1) a means for producing a periodic signal the frequency of which is an integer divisor of the the mix frequencies, (2) a means for producing an enabling signal whenever a change occurs in the selection of the frequency being synthesized, the duration of the enabling signal being sufficient to ensure coincidence of it and said periodic signal, and (3) a means for resetting the frequency divider of each mix and filter stage to a predetermined state whenever there is a coincidence of the enabling signal and the periodic signal.

An object of this invention is to provide a means whereby the phase of signals synthesized by direct mix/filter frequency synthesizers can be determinate.

A further object of this invention is to provide a means by which the frequency dividers used in mix and filter stages of direct mix/filter frquency synthesizers can be reset to a predetermined state each time a change occurs in the selection of output frequencies.

Other objects of this invention will be readily discernible upon reading of the text hereinafter.

DESCRIPTION OF THE PREFERRED EMBODIMENT

Figures 1, 2:
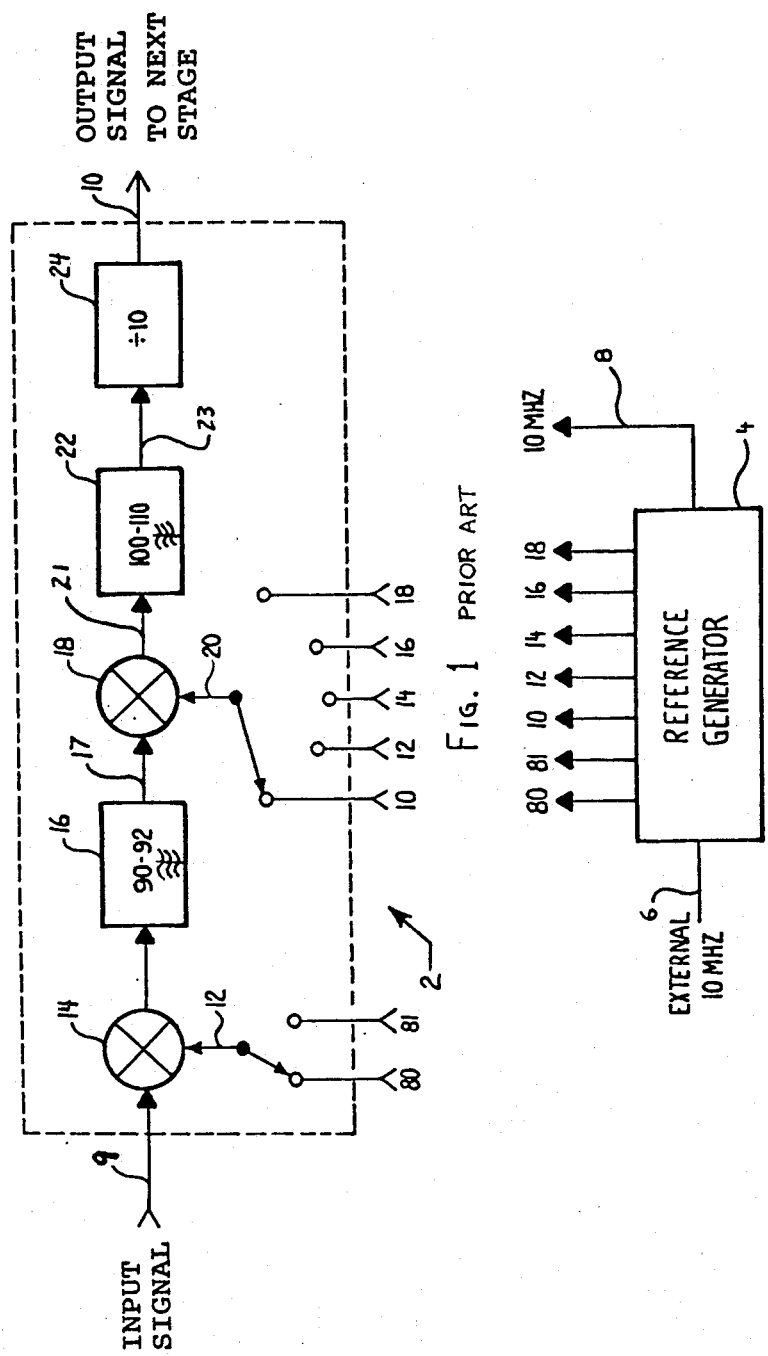
FIG. 1 is a functional block diagram of a mix and filter stage of a conventional direct mix/filter synthesizer.
FIG. 2 is a functional block diagram of a mix frequency generator of a conventional direct mix/filter synthesizer.

Referring to FIGS. 1 and 2, one of a plurality of serially gangable mix and filter stages, generally designated 2, is shown along with a mix frequency generator 4. The mix frequency generator receives as its reference frequency a periodic signal 6 from a reference oscillator, typically 10 Mhz from an external source. The mix frequency generator buffers the external 10 Mhz reference frequency signal 6, and communicates the buffered 10 Mhz signal 8 to a plurality of mix and filter stages 2. The mix frequency generator 4 also uses the incoming 10 Mhz reference frequency signal 6 to derive by well known techniques (such as by phase-locked loop oscillators located to the reference frequency or mutlipliers (not shown) a set of periodic signals of certain frequencies (herein referred to as "mix frequencies") which when mixed in a mix and filter stage 2 will produce selectable incremental steps in the mix and filter stage output signal 10. The frequencies of the set of mixing signals can be described as "first mix" freqencies and "second mix" frequencies, the nomeclature referring to the order in which said mix frequencies are selected and mixed with a stage input frequency 9. For example the first mix frequencies can be 80 Mhz and 81 Mhz, and the second mix frequencies can be 12 Mhz, 14 Mhz, 16 Mhz, and 18 Mhz.

Referring again to FIGS. 1 and 2, a first mix switch 12 selects either of the two first mix signals, 80 Mhz or 81 Mhz, and the selected mix frequency is fed to a first mixer 14 where it is mixed with the stage input signal 9, which in the case of the first stage is the buffered 10 Mhz signal 8. The output of the first mixer is communicated to a first filter 16 which removes the difference frequencies. Depending on the first mix switch 12 setting, the output signal 17 of the first filter 16 is a periodic signal with a frequency equal to the frequency of the input signal 9 plus either 80 Mhz or 81 Mhz. The output signal 17 of the first filter is communicated to a second mixer 18 where it is mixed with a second mix signal (12 Mhz, 14 Mhz, 16 Mhz or 18 Mhz) selected by a second mix switch 20. The output signal 21 of the second mixer 18 is fed to a second filter 22 which removes difference frequencies. Depending on the setting of the second mix switch 20 the output 23 of the second filter is a signal with a frequency in the range of the input signal 9 frequency plus 90 Mhz to 99 Mhz in incremental steps of 1 Mhz. Up to this point in the stage 2, all of the signals are processed by linear elements of the stage. Non-linearity occurs when the output 23 of the second mix filter is divided by the base number ten by a divider 24.

Each mix and filter stage 2 adds one more digit of resolution to the synthesizers output frequency. For example, to generate 10.27 Mhz two such decade stages are ganged. The first mix and filter stage receives the buffered 10 Mhz signal 8 as its input signal 9, and is configured to generate 10.7 Mhz by the selection of 81 Mhz from the mix frequency generator as a first mix frequency, and the selection of 16 Mhz as a second mix frequency. By the first selection, the output of the first filter 16 will be 91 Mhz (81 Mhz+10 Mhz) which is then mixed with the 16 Mhz to produce 107 Mhz (91 Mhz+16 Mhz) at the output of the second filter 22. The 107 Mhz is then divided by 10 to produce the 10.7 Mhz. The 10.7 Mhz output of the first stage is communicated to the second stage in which the 80 Mhz is selected as a first mix frequency resulting in 90.7 Mhz at the output of the second stage first mixer. The 90.7 Mhz is then mixed with 12 Mhz which was selected as a second mix frequency resulting in 102.7 Mhz at the output of the second stage second mixer. This is then divided by 10 to produce the desired 10.27 Mhz signal. Subsequent decade stages will add more digits of resolution in a like manner.

It should be noted that all of the frequencies generated by the mix frequency generator 4, including the buffered 10 Mhz signal 8 are evenly divisible by 1 Mhz. Since they all have 1 Mhz as a common divisor, they all complete an integer number of cycles within the one microsecond (us) period of the 1 Mhz common divisor. It should also be noted that at certain points in time all of said frequencies can be at a common phase, e.g. zero crossing, simultaneously because they are linearly generated and are all locked onto the externally sourced 10 Mhz signal 6. It can therefore be seen that these common phase points in time are at regular 1 microsecond (us) intervals.

Figure 3:
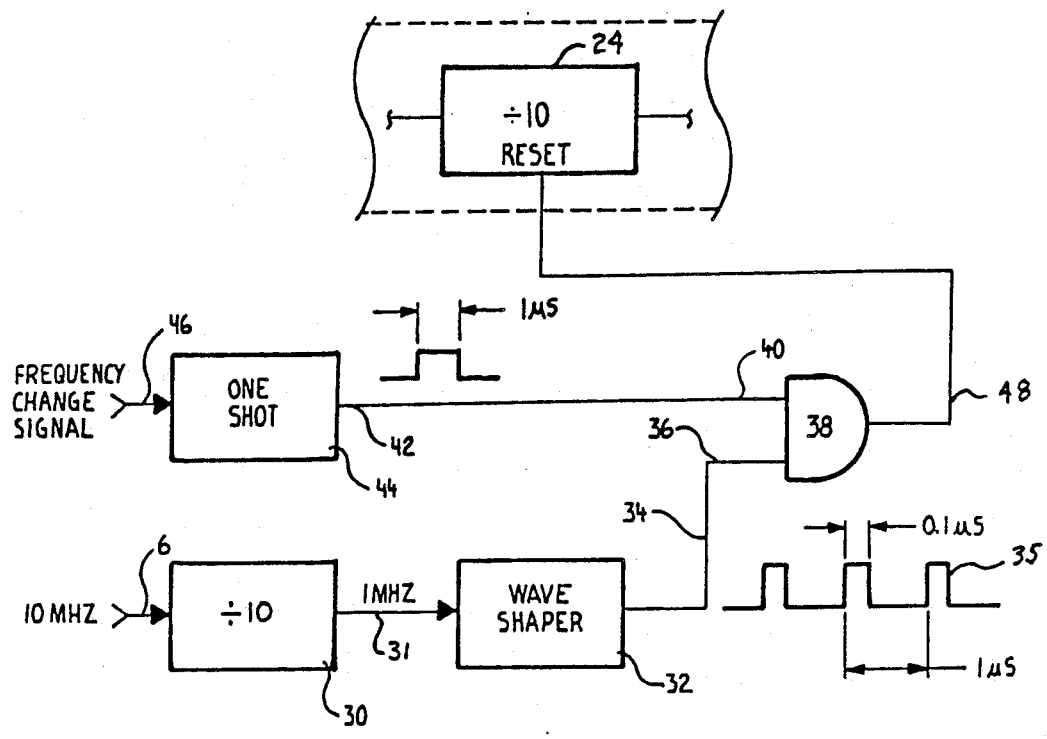
FIG. 3 is a functional block diagram of the improvement to a direct mix/filter synthesizer.

Referring to FIG. 3, the improvement of this invention is shown to have a dividing means 30, such as a decade counter, which divides the externally sourced 10 Mhz signal 6 by ten to achieve a 1 Mhz periodic signal 31, the common divisor frequency. The 1 Mhz common divisor signal 31 is then shaped by a wave shaping circuit 32 which transforms the signal, e.g. by differentiating it, into a train 34 of uniformly spaced pulses 35, preferably one pulse per cycle of the common divisor signal 31. The pulse can be any suitable width less than a period of said signal. The pulses are communicated to one input 36 of a two-input, logical "and" gate 38. The other input 40 of the "and" gate is in signal communication with an output 42 of a triggerable single-pulse generator 44, such as a monostable multivibrator, commonly referred to as a "one-shot." The one-shot is responsive to a trigger signal 46 and is operative to produce in response thereto a single enabling pulse. The trigger signal 46 is produced by conventional means (not shown) in response to an operator changing one or more of the mix switches, 16 and 22, indicating a change in frequency. The enabling pulse from the one-shot allows at least one of the pulses 35 from the wave shaper 32 to pas through the "and" gate 38. The output of the "and" gate 38 is used as a reset signal to reset all of the divide by ten circuits 24 of all of the stages to a predetermined state. This has the effect of starting the generation of each newly selected frequency with the divide by ten circuits 24 of all of the mix and filter stages in a common state. Thus, all frequencies start off in the same position and in the same quadrant and are therefore started in the same phase. As shown, the pulse width of the pulses 35 in the train 34 are 0.1 us because that is a preferable width for the reset signal, but since said pulse width is substantially less than a period of the common divisor frequency, the duration of the one-shot pulse must be at least equal to the period of the common divisor frequency, in this case at least 1 us, to ensure coincidence.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

I claim:

1. In a frequency synthesizer having a generator which linearly produces mix frequencies from a reference oscillator signal, and having at least one mix and filter stage, each such stage having a frequency divider, the improvement comprising:
   (a) means for producing a periodic signal the frequency of which is an integer divisor of all the mix frequencies,
   (b) means for producing an enabling signal whenever a change occurs in the selection of a frequency of a signal being synthesized, a duration of the enabling signal being sufficient to ensure at least partial coincidence of it and said periodic signal, and
   (c) means for resetting the frequency divider of each mix and filter stage to a predetermined stage whenever there is a at least partial coincidence of the enabling signal and said periodic signal.

2. The improvement according to claim 1 wherein the means for producing the periodic signal comprises a frequency divider which divides the reference oscillator signal down into a periodic signal the frequency of which is an integer divisor of all the mix frequencies.

3. The improvement according to claim 2 further comprising a means for shaping the wave of said periodic signal into a train of periodic pulses of the same frequency.

4. The improvement according to claim 3 wherein the means for resetting the frequency dividers of each mix and filter stage is a coincidence gate which produces a reset signal whenever there is at least partial coincidence of the enabling signal and a pulse from the pulse train.

5. The improvement according to claim 1 wherein the enabling signal is of sufficient duration to ensure substantially full coincidence of it and a cycle of said periodic signal.

6. The improvement according to claim 4 wherein the enabling signal is of sufficient duration to ensure substantially full coincidence of it and a pulse of said pulse train.

7. In a frequency synthesizer having a generator which linearly produces mix frequencies from a reference oscillator signal, and having at least one mix and filter stage, each such stage having a frequency divider, the improvement comprising:
   (a) a frequency divider which divides the reference oscillator signal down into a periodic signal the frequency of which is an integer divisor of all the mix frequencies, (b) a wave shaper which transforms said periodic signal into a train of periodic pulses of the same frequency, (c) a single-pulse generator responsive to produce an enabling signal whenever a change occurs in the selection of a frequency of a signal being synthesized, a duration of the enabling signal being sufficient to ensure at least partial coincidence of it and one of the pulses of said pulse train, and (d) a gate circuit for producing and communicating a reset signal to the frequency divider of each mix and filter stage to reset said divider or dividers to a predetermined state whenever there is at least partial coincidence of the enabling signal and said pulse.

8. The improvement according to claim 7 wherein the enabling signal is of sufficient duration to ensure substantially full coincidence of it and a pulse of said pulse train.

9. The improvement of claim 1 wherein the means for producing the enabling signal is a single-pulse generator which produces the enabling signal whenever a change occurs in the selection of the frequency of the signal being synthesized.

10. The improvement of claim 2 wherein the means for producing the enabling signal is a single-pulse generator which produces the enabling signal whenever a change occurs in the selection of the frequency of the signal being synthesized.

11. The improvement of claim 3 wherein the means for producing the enabling signal is a single-pulse generator which produces the enabling signal whenever a change occurs in the selection of the frequency of the signal being synthesized.

12. The improvement of claim 7 wherein the single-pulse generator is a one-shot triggerable by a signal which occurs whenever a change occurs in the selection of the frequency of the signal being synthesized.

13. The improvement of claim 9 wherein the single-pulse generator is a one-shot triggerable by a signal which occurs whenever a change occurs in the selection of the frequency of the signal being synthesized.

14. The improvement of claim 10 wherein the signal-pulse generator is a one-shot triggerable by a signal which occurs whenever a change occurs in the selection of the frequency of the signal being synthesized.

15. The improvement of claim 11 wherein the single-pulse generator is a one-shot triggerable by a signal which occurs whenever a change occurs in the selection of the frequency of the signal being synthesized.

* * * * *